(12) United States Patent
Corliss

(10) Patent No.: US 11,114,065 B1
(45) Date of Patent: Sep. 7, 2021

(54) COMPUTER HAVING A REMOTE SECOND DISPLAY

(76) Inventor: Gregory J. Corliss, South Jordan, UT (US)

(*) Notice: Subject to any disclaimer, the term of this patent is extended or adjusted under 35 U.S.C. 154(b) by 1660 days.

(21) Appl. No.: 11/941,011

(22) Filed: Nov. 15, 2007

Related U.S. Application Data

(63) Continuation-in-part of application No. 10/680,907, filed on Oct. 8, 2003, now abandoned.

(51) Int. Cl.
| | |
|---|---|
| *G09G 5/12* | (2006.01) |
| *G09G 5/14* | (2006.01) |
| *G06F 3/14* | (2006.01) |
| *G06F 1/16* | (2006.01) |
| *H01L 27/32* | (2006.01) |
| *H04N 21/41* | (2011.01) |

(52) U.S. Cl.
CPC .............. *G09G 5/12* (2013.01); *G06F 1/1647* (2013.01); *G06F 3/1423* (2013.01); *G06F 3/1446* (2013.01); *G06F 3/1454* (2013.01); *G09G 5/14* (2013.01); *A63F 2300/301* (2013.01); *G09G 2370/04* (2013.01); *G09G 2370/042* (2013.01); *G09G 2370/16* (2013.01); *H01L 27/3267* (2013.01); *H04N 21/4122* (2013.01)

(58) Field of Classification Search
CPC .... G06F 1/1601; G06F 1/1632; G06F 1/1647; G06F 3/1432; G06F 3/1454; G09G 5/00; G09G 5/12; G09G 5/14
USPC ..................................................... 345/1.1–3.4
See application file for complete search history.

(56) References Cited

U.S. PATENT DOCUMENTS

| | | | |
|---|---|---|---|
| 5,768,163 A * | 6/1998 | Smith, II ...................... 708/105 |
| 6,580,422 B1 * | 6/2003 | Reilly ............................ 345/2.2 |
| 6,784,855 B2 * | 8/2004 | Matthews et al. ............. 345/1.1 |
| 6,956,542 B2 * | 10/2005 | Okuley et al. ................ 345/1.1 |
| 7,136,282 B1 * | 11/2006 | Rebeske ........................ 345/1.1 |
| 8,081,964 B1 * | 12/2011 | Enzmann .............. G06F 3/1454 |
| | | | 455/420 |
| 2002/0024499 A1 * | 2/2002 | Karidis ................. G06F 1/1632 |
| | | | 345/156 |
| 2003/0227438 A1 * | 12/2003 | Campbell et al. ............ 345/156 |
| 2004/0119660 A1 * | 6/2004 | Okuley et al. ................ 345/2.1 |
| 2006/0082518 A1 * | 4/2006 | Ram ..................... G06F 3/1446 |
| | | | 345/1.1 |

* cited by examiner

*Primary Examiner* — Kevin M Nguyen
(74) *Attorney, Agent, or Firm* — Jason P. Webb; Pearson Butler

(57) ABSTRACT

A personal computer provides a video signal to dual first and second displays, the second display remote from the computer receiving its video signal by telemetry instead of through a video cable. A video signal transmitter connects to the computer through a transmitter cable plugged into a computer display port. The cable from the second display that would otherwise be plugged into the computer video port is instead connected to a video signal receiver. The signal is then transmitted from the computer by the connected transmitter to the receiver connected to the second display. The second display may detachably mount to the back of the first display.

10 Claims, 4 Drawing Sheets

COMPUTER HAVING A REMOTE SECOND DISPLAY

This application is a continuation in part of U.S. application Ser. No. 10/680,907 filed Oct. 8, 2003 now abandoned

BACKGROUND

Field of the Invention

This invention relates to personal computers and more specifically to a computer that supports dual display monitors (hereinafter "display") wherein at least one of the monitors is detached, receiving its video signal by telemetry.

Prior Art

It is known to have a personal computer that supports dual displays, both receiving their video signals through electric cables connected to the computer. Both displays may be driven by the same video signal resulting in duplicate display content being displayed on the respective displays. Dual displays are also frequently used by a single user to display more content than is conveniently displayed on a single computer.

Use of dual displays is also convenient, for example, when more than one person wishes to observe the displayed content. Such might be the case when an operator is presenting display content to another person or group of persons not in the same location or in an orientation that makes observation of the operator's display ineffective or inconvenient. In such cases, tethering the second display to the computer limits its use. Certainly, the cable connection limits the distance from the computer to the other person or group. The other person also has limited freedom of movement. Even in an office environment, to see a tabletop display the second observer is required to sit uncomfortably forward toward the display It would be more convenient to have a second display detached from the computer. This is possible if the second display is not dependent on a video cable for its video signal.

SUMMARY

The present invention comprises a computer having a first display and further including a second display remote from the computer receiving its video signal by telemetry instead of through a video cable.

It is known to have a computer that supports two displays with display content duplicated on the respective computers. The improvement comprises a video signal transmitter connected to the computer through a transmitter cable plugged into a computer video port. A cable from the second display that would otherwise be plugged into the computer video port is instead connected to a compatible port of a video signal receiver. The signal is then transmitted from the computer by the connected transmitter to the receiver connected to the second display. In an alternate embodiment, telemetry between the second display and the computer is achieved as is presently done with computers remotely accessing an internet server employing remote access card technology. Thus, a second observer can move from place to place with the second display, or just sit comfortably in an office holding the second display.

In practice, the first and second displays are both thin panel displays, such as are well know with LCD (liquid crystal display) technology. The second display may detachably mount to the back of the first display. It then can be used as a two-sided display or it can be detached and carried to a more convenient or comfortable location where it is viewed separately by the second observer as an operator generates display content from the computer. At least when detached, the second display is battery powered.

In one non-limiting embodiment, there is a dual display computer comprising: a first display receiving its video signal directly from a first computer to which it is functionally connected and at all times dedicated exclusively to the first computer, a stand alone second display also at all times dedicated exclusively to the first computer, thus separate from and otherwise unassociated with a second computer, the second display being physically detached or detachable from the first computer and receiving its video signal directly and exclusively from the first computer by telemetry without a second computer intermediate the second display and the first computer such that display content displayed on the first display is displayed on the second display.

In another non-limiting embodiment, there is a dual display computer comprising a first display receiving its video signal directly from a first computer to which it is functionally connected and at all times dedicated exclusively to the first computer, a stand alone second display also at all times dedicated exclusively to the first computer, thus separate from and otherwise unassociated with a second computer, the second display being physically detached from the first computer and receiving its video signal directly and exclusively from the first computer by telemetry without a second computer intermediate the second display and the first computer such that display content displayed on the first display is displayed on the second display, wherein the second display is attachable and detachable from the first display, wherein the first computer comprises a video port through which a video signal formatted to drive a display is communicated to it; and wherein a transmitter adapted to telemeter a video signal to a receiver is connected to the first computer by a cable with a cable connector plugged into said video port; and wherein the second display is connected to said receiver, which receiver is adapted to receive said video signal telemetered from the transmitter and is further adapted to communicate said video signal to said second display, wherein the second display is removable from the first display to a convenient location by an observer, the second display being adapted for quick and facile transport by the observer and further adapted as a lightweight display for viewing while being hand held by the observer.

In still another embodiment, there is a dual display computer comprising a first display receiving its video signal directly from a first computer to which it is functionally connected and at all times dedicated exclusively to the first computer, a stand alone second display also at all times dedicated exclusively to the first computer, thus separate from and otherwise unassociated with any other computer, the second display being physically detachable from the first computer and receiving its video signal directly and exclusively from the first computer by telemetry without any other computer intermediate the second display and the first computer such that display content displayed on the first display is displayed on the second display.

DETAILED DESCRIPTION OF THE PREFERRED EMBODIMENT

Figure 1:
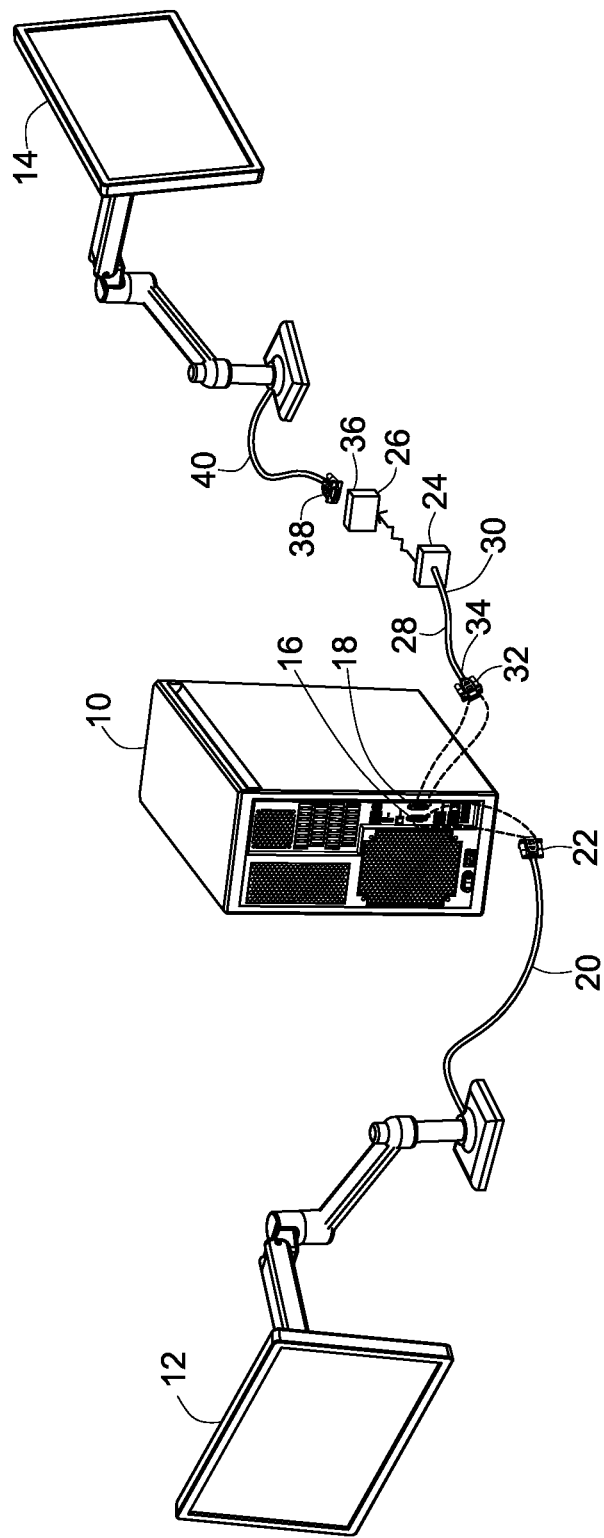
FIG. 1 is a pictorial view illustrating the configuration of a second display displaying the same content that is displayed on the display of a personal computer, which is detached and separate from the computer.
Figure 2:
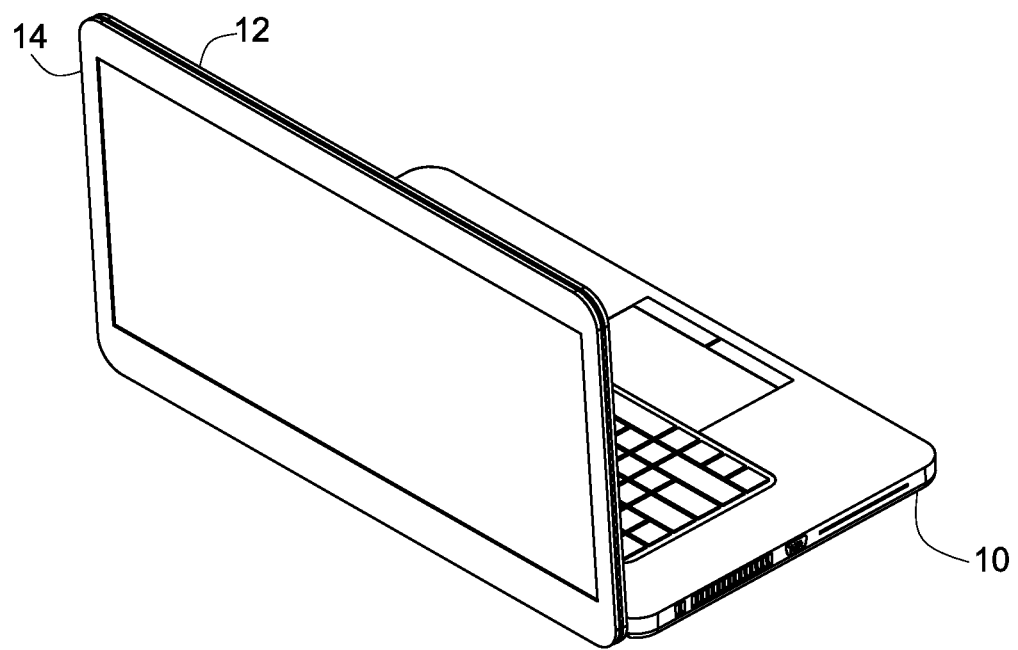
FIG. 2 is another pictorial view illustrating the second display mounted to the back of the first display.
Figure 3:
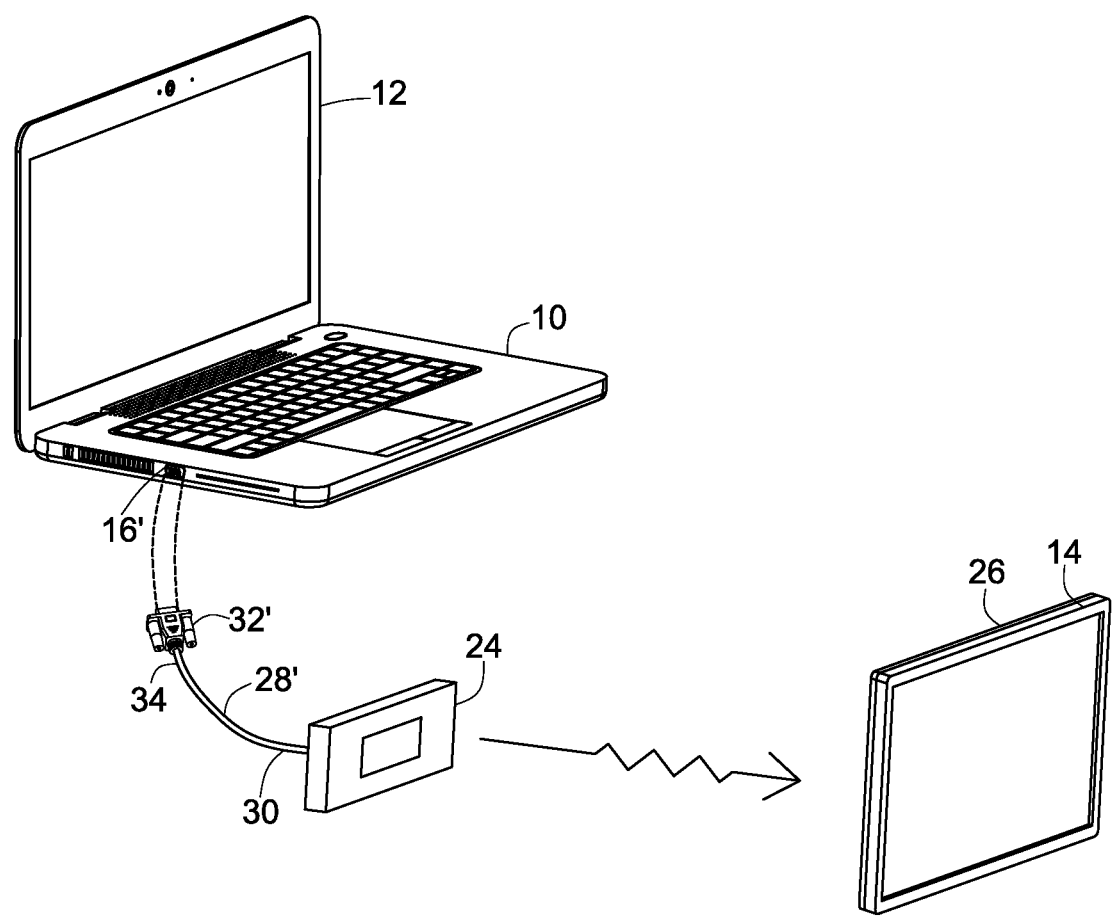
FIG. 3 is illustrates a first display that receives its video signal internally from the computer (without cables) and a second display receiving its video signal by telemetry.
Figure 5:
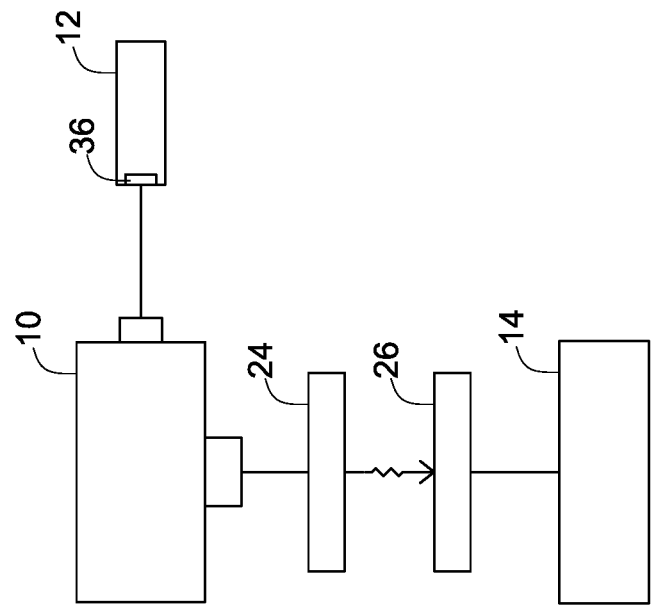
FIG. 5 is a schematic block diagram of the dual display personal computer of the present invention.
Figure 4:
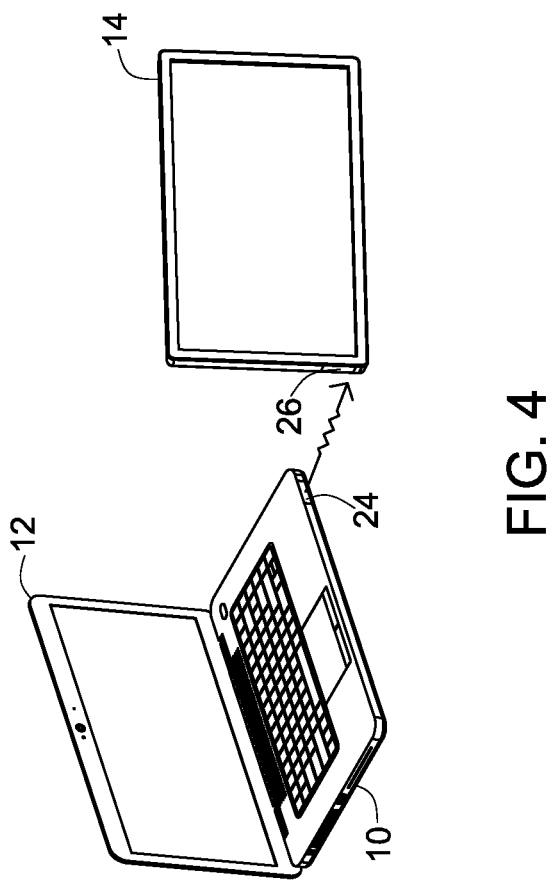
FIG. 4 is a pictorial view of an alternative embodiment showing the transmitter integral to the computer and the receiver integral to the second display.

For these purposes a display means a display screen or monitor and only those electronics required to receive a video signal and to appropriately display a video signal on the screen or monitor as known in the art but otherwise does not include a data input device. Thus, the display displays a video signal communicated to it but it does not have the capability to generate a video signal itself. The term "stand alone" when referring to a display means the display includes a telecommunication receiver that receives a telemetered video signal generated by a first computer separate from the display but otherwise does not include nor is it in any way otherwise associated with that first computer or a second computer or a keyboard or other data input device. The display not associated with a second computer means the display is not capable of optionally functioning as the display of that second computer, which thus excludes the option in the second computer of making its display available to a first computer so the display of the second computer may receive a video signal or other display data from that first computer, whether or not the second computer processes the video signal or other display data. Thus a stand alone display is not a display of a second computer with the second computer configured with capability such that its display may optionally function as a display for the second computer and alternatively as a display for a first computer. The term "separate" means the only communication to the display is from a computer through telecommunication, that is, a telemetered video signal transmitted from the computer and received by the display. The term "computer" means a computing device that includes a processor, a memory device, a data input device such as a keyboard, and a display dedicated exclusively to the computing device. Thus, a computing device that does not have its own display dedicated exclusively to the computing device is not deemed to be a computer for all purposes herein.

The dual display computer of the present invention comprises a computer 10 having a first display 12 dedicated exclusively to the computer 10 and further comprises a stand alone second display 14 separate from the computer and at all times also dedicated exclusively to the computer 10, each display receiving a same video signal 16 from the computer 10. A display dedicated exclusively to a computer means the display is for use for no other purpose but as a display for that computer.

The second display 14 is separate and potentially remote, detached or attached, or attachable and detachable from the computer 10 without cable connection to the computer, receiving its video signal from the computer by telemetry such that display content displayed on the first display 12 is displayed on the second display 14. Thus, the display content on the first display 12 is viewable on the second display 14, including while it is separate and remote from and physically disconnected from the computer 10 or when it is physically attached to the computer 10, such as attached back to back with the first display.

In one embodiment, the computer 10 comprises dual first and second video signal output ports, or video ports, 16 and 18 through which video signals formatted to drive the displays 12 and 14 are communicated to them. For purposes herein, a video port is meant to comprise an electronic port configured to accept a cable connector from a display cable through which video signals formatted to drive a display may be communicated. The first display 12 is connected to the computer 10 by first cable 20 with a video cable connector 22 plugged into the first video port 16. A transmitter 24 adapted to telemeter a video signal to a receiver 26 has a transmitter cable 28 connected to the transmitter 24 at a cable first end 30 connecting the transmitter 24 to the computer 10 through a cable connector 32 at a cable second end 34 plugged into the second video port 18. The second display 14 is electrically connected to the receiver 26, which is adapted to receive the video signal telemetered from the transmitter 24, which then communicates that video signal directly to the second display 18 (directly means not through other electronic paraphernalia such as a second computer or switches prior to the second display 14 that direct the video signal for various alternative uses). The receiver 26 has a video port 36 configured to receive a video cable connector 38 from a display cable 40 through which video port the video signals are communicated directly to the display 18.

In another embodiment, the first display 12 receives its video signal internally from the computer 10 to which it is attached. The computer 10 also comprises a video port 16' through which a video signal may be routed to a second display 14. A transmitter 24 adapted to telemeter a video signal to a receiver 26 is connected to the computer 10 by a cable 28' with a cable connector 32' plugged into said video port 16'. The second display 14 is then connected to the receiver 26, which is adapted to receive the video signal telemetered from the transmitter 24 which then communicates that video signal to the second display 14.

It should be understood that the described cables are meant to define a configuration for communicating the video signal between described components. Any other device or configuration that achieves the same end is meant to be included in the term, cable. Such as, for example, the described transmitter may be integral in the computer. Similarly, the described receiver may be integral in the second display. Likewise, the description of the invention as provided is meant to convey the preferred embodiment for achieving a normal personal computer with its first display together with a second separate and independent display receiving a video signal from the same personal computer to display the same display content that is displayed on the first display such that two persons may have their own display adapted to the convenience of each while both view the same display content generated from the one computer. It is intended that the second display is light weight and mobile, comparable in size and weight to a display of a laptop computer but significantly less expensive than a laptop computer such that the second display is removable from the first display to a convenient location by an observer, the second display being adapted for quick and facile transport by the observer and further adapted as a lightweight display for viewing while being hand held by the observer. Lightweight is deemed to mean that it can be easily lifted by a single hand of a normal person with only minor effort, which would be the case for a display weighing approximately two or three pounds. Quick and facile transport is deemed to mean lightweight and unencumbered by peripheral paraphernalia such as cables or attached equipment, except perhaps a video signal receiver if one is not internal to the display.

Those skilled in the art will recognize various hardware and software products available in the art or which can be adapted to achieve this described result, all of which are deemed to be included in this disclosure though not explicitly described herein.

Having described the invention, what is claimed is as follows:

1. A dual display computer comprising
  a first display receiving its video signal directly from a first computer to which it is functionally connected and at all times dedicated exclusively to the first computer,
  a stand alone second display, mounted to a back of the first display, also at all times dedicated exclusively to the first computer, thus separate from and otherwise unassociated with a second computer, the second display being physically detached or detachable from the first computer and receiving its video signal directly and exclusively from the first computer by telemetry without a second computer intermediate the second display and the first computer such that display content displayed on the first display is displayed on the second display.

2. The dual display computer of claim 1 wherein the second display is physically detached from the computer.

3. The dual display computer of claim 1
  wherein the first computer comprises dual primary and secondary video ports through which video signals formatted to drive the displays are communicated to them; and
  wherein the first display is connected to the first computer by cable plugged into said first video port; and
  wherein a transmitter adapted to telemeter a video signal to a receiver is connected to the first computer by a cable plugged into said second video port; and
  wherein the second display is connected to said receiver, which receiver is adapted to receive said video signal telemetered from the transmitter and is further adapted to communicate said video signal to said second display.

4. The dual display computer of claim 1
  wherein the first display receives its video signal internally from the first computer to which it is attached; and
  wherein the first computer comprises a video port through which a video signal formatted to drive a display is communicated to it; and
  wherein a transmitter adapted to telemeter a video signal to a receiver is connected to the first computer by a cable with a cable connector plugged into said video port; and
  wherein the second display is connected to said receiver which receiver is adapted to receive said video signal telemetered from the transmitter and is further adapted to communicate said video signal to said second display.

5. The dual display computer of claim 1
  wherein the first display receives its video signal internally from the computer to which it is attached; and
  wherein the first computer comprises a transmitter integral in the computer, which transmitter is adapted t telemeter a video signal to a receiver; and
  wherein the second display comprises said receiver integral in the computer, which transmitter is adapted to telemeter a video signal to a receiver; and
  wherein the second display comprises said receiver integral in the display, which receiver is adapted to receive said video signal telemetered from the transmitter.

6. The dual display computer of claim 1 wherein the second display is attachable and detachable from the first display.

7. The dual display computer of claim 6 wherein the second display is releasably attachable back to back to the first display such that an observer may view display content on the second display as it is also displayed on the first display as a computer user generates and views the display content on the first display as the computer user operates the computer with the first and second displays located between the computer user and the observer.

8. The dual display computer of claim 6, wherein the second display is removable from the first display to a convenient location by an observer, the second display being adapted for quick and facile transport by the observer and further adapted as a lightweight display for viewing while being hand held by the observer.

9. A dual display computer comprising
  a first display receiving its video signal directly from a first computer to which it is functionally connected and at all times dedicated exclusively to the first computer,
  a stand alone second display also at all times dedicated exclusively to the first computer, thus separate from and otherwise unassociated with a second computer, the second display being physically detached from the first computer and receiving its video signal directly and exclusively from the first computer by telemetry without a second computer intermediate the second display and the first computer such that display content displayed on the first display is displayed on the second display, wherein the second display is attachable and detachable from the first display,
  wherein the first computer comprises a video port through which a video signal formatted to drive a display is communicated to it; and
  wherein a transmitter adapted to telemeter a video signal to a receiver is connected to the first computer by a cable with a cable connector plugged into said video port; and
  wherein the second display is connected to said receiver, which receiver is adapted to receive said video signal telemetered from the transmitter and is further adapted to communicate said video signal to said second display,
  wherein the second display is removable from the first display to a convenient location by an observer, the second display being adapted for quick and facile transport by the observer and further adapted as a lightweight display for viewing while being hand held by the observer.

10. A dual display computer comprising
  a first display receiving its video signal directly from a first computer to which it is functionally connected and at all times dedicated exclusively to the first computer,
  a stand alone second display also at all times dedicated exclusively to the first computer, thus separate from and otherwise unassociated with any other computer, the second display being physically detachable from the first computer at a rear of the first display and receiving its video signal directly and exclusively from the first computer by telemetry without any other computer intermediate the second display and the first computer such that display content displayed on the first display is displayed on the second display.

* * * * *